Feb. 2, 1965 J. F. GIBBONS 3,168,704

MULTIVIBRATOR AMPLIFIER WITH TIME DELAY MODULATING AUDIO INPUT

Filed March 6, 1961 4 Sheets-Sheet 1

JAMES F. GIBBONS
*INVENTOR.*

*BY*

Flehr and Swain
ATTORNEYS

MULTIVIBRATOR AMPLIFIER WITH TIME DELAY MODULATING AUDIO INPUT

Filed March 6, 1961

JAMES F. GIBBONS
*INVENTOR.*

*BY*

Flehr and Swain
ATTORNEYS

MULTIVIBRATOR AMPLIFIER WITH TIME DELAY MODULATING AUDIO INPUT

Filed March 6, 1961 4 Sheets-Sheet 3

JAMES F. GIBBONS
*INVENTOR.*

*BY*

Flehr and Swain
ATTORNEYS

Feb. 2, 1965 J. F. GIBBONS 3,168,704

MULTIVIBRATOR AMPLIFIER WITH TIME DELAY MODULATING AUDIO INPUT

Filed March 6, 1961 4 Sheets-Sheet 4

JAMES F. GIBBONS
*INVENTOR.*

*BY*

Flehr and Swain
ATTORNEYS

United States Patent Office 3,168,704
Patented Feb. 2, 1965

3,168,704

MULTIVIBRATOR AMPLIFIER WITH TIME DELAY MODULATING AUDIO INPUT

James F. Gibbons, Palo Alto, Calif., assignor to Clevite Corporation, Cleveland, Ohio, a corporation of Ohio Filed Mar. 6, 1961, Ser. No. 93,577
3 Claims. (Cl. 330—10)

This invention relates generally to an audio amplifier and more particularly to an audio amplifier employing as active elements semiconductive switching devices.

It is a general object of the present invention to provide an audio amplifier which is simple and inexpensive to manufacture and yet capable of amplifying audio signals with a high degree of fidelity.

It is another object of the present invention to provide a high power audio amplifier having a minimum of components.

It is another object of the present invention to provide an audio amplifier circuit in which the active elements comprise semiconductive switching devices of the type having a first state in which the devices present a relatively high impedance and a second state in which the device present a relatively low impedance. The switching devices being such that they are switched from the first or high impedance state to the second or low impedance state in response to a predetermined switching voltage, $V_B$, and switched from the second or low impedance state to the first or high impedance state when the current through the device is reduced below a predetermined holding current value, $I_H$.

The audio amplifier of the present invention employs modulators which form either a frequency modulated pulse train or a pair of pulse trains, one of which has its pulses time modulated with respect to the other. The pulses are applied to multivibrator circuits either monostable or bistable, which circuits are switched in response to the modulated input pulses and form an output containing the audio information at an amplified level. An averaging filter circuit, for example, a loudspeaker, is connected to receive the pulse train from the multivibrator and recover the audio information.

The foregoing and other objects of the invention will become more clearly apparent from the following description when taken in conjunction with the accompanying drawing.

Referring to the drawing.

Figure 1:
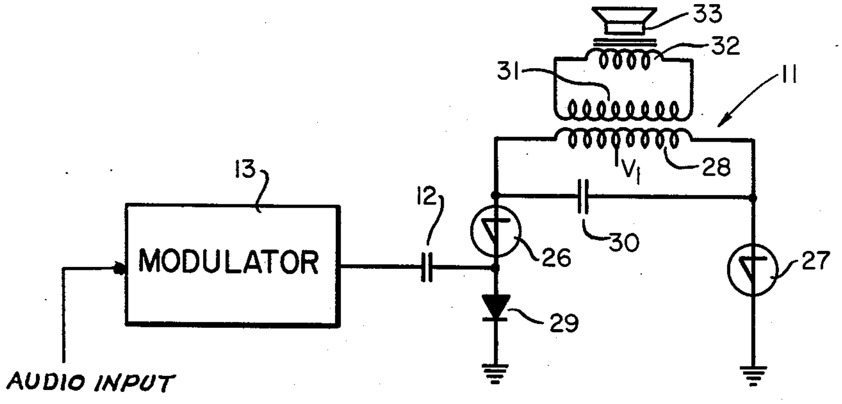
FIGURE 1 shows an audio amplifier circuit employing a modulator and a monostable multivibrator circuit.

Referring to FIGURE 1, there is shown a monostable power amplifier circuit 11 capacitively coupled by capacitor 12 to a modulator 13. The modulator 13 may be any suitable modulator serving to provide pulses having a mean frequency, which is modulated by an audio signal to provide a frequency modulated pulse train.

Figure 7:
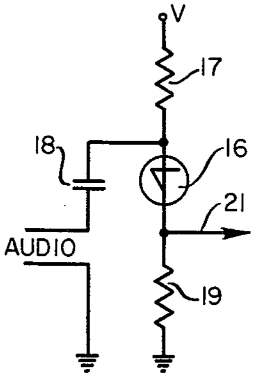
FIGURE 7 shows a modulator circuit suitable for use in the circuit of FIGURE 1.
Figure 8:
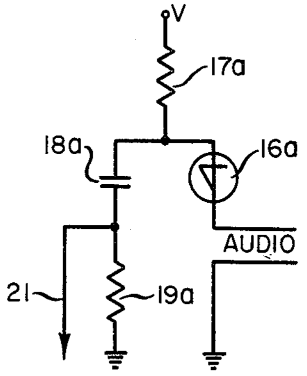
FIGURE 8 shows another modulator circuit suitable for use in the circuit of FIGURE 1.
Figure 9:
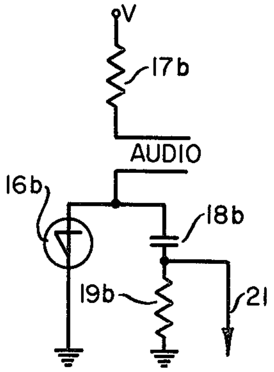
FIGURE 9 shows still another modulator circuit suitable for use in the circuit shown in FIGURE 1.

Suitable modulators 13 are shown in FIGURES 7, 8 and 9. Basically, the frequency modulated oscillator comprises a semiconductor switching device 16 connected in a series combination with a current limiting resistor 17. A capacitor 18 is connected in shunt with switching device 16. This basic combination, in general, forms the oscillator. However, a load resistor 19 is provided for developing frequency modulated output pulses which are available at a line 21.

Switching devices suitable for use in this type of oscillator, in general, are such that the current through the device is relatively low when the device is in its high impedance stable state. The impedance of the device in this state may be in the order of 10 megohms or more. As the voltage across the device is increased, a voltage $V_B$ is reached at which point the device becomes unstable. The device is rapidly switched into its low impedance stable state. In this state, the impedance of the device is low, in the order of 5 ohms or less. The device remains in its low impedance state until the current is reduced to a value below the holding current $I_H$; the device then switches to its high impedance, low current state.

Referring again to FIGURE 7, a supply voltage V is applied to the series combination including resistor 17, diode 16, and load or output resistor 19. The voltage is selected such that it is greater than the switching voltage, $V_B$, of the semiconductor switching device 16. The resistor 17 is selected so that when the device 16 is switched to its low impedance state, the current flowing through the device is limited to a value below its holding current. $I_H$, whereby the device immediately switches back to its high impedance state.

In operation, the voltage causes current to flow through the resistor 17 to charge the capacitor 18. As the capacitor charges towards the voltage V, a voltage is reached above the breakdown voltage $V_B$ of the device 16, at which time the device switches into its low impedance state and current flows through the resistor 19 developing a voltage across the same which appears in the form of a pulse on the line 21. The capacitor discharges through the device 16 to add to the current flowing through resistor 17 so that the total current is above the holding current. However, as the capacitor discharges, the current is reduced below its holding value, the device reverts to its high impedance state, the capacitor again charges and the process is repeated. The frequency of oscillation is primarily dependent on the time constant of resistor 17 and capacitor 18.

It is noted that in the circuit shown in FIGURE 7, audio signal voltage to be amplified is applied to the capacitor 18. The audio signal serves to add or subtract from the voltage across the capacitor whereby the frequency of operation of the circuit is modulated in accordance with the audio signal.

The circuit shown in FIGURE 8 is similar to the circuit shown in FIGURE 7 with the components arranged in a slightly different manner. However, the operation is identical and will not be described further. Similarly, in FIGURE 9, the components are arranged in a different manner and the audio signal is applied in a different point. However, again, the operation is similar and will not be described in further detail. A more complete description of oscillator circuits of this type can be found in copending application Serial No. 93,384, filed March 6, 1961.

Figure 10:
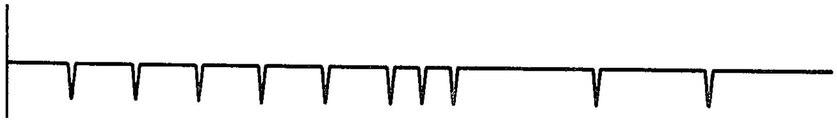
FIGURE 10 shows the output of modulators of the type shown in FIGURES 7, 8 and 9.

Referring to FIGURE 10, a frequently modulated pulse train of the type available at the terminal 21 of the oscillators in FIGURES 7, 8 and 9 is schematically illustrated.

Referring again to FIGURE 1, the power amplifier stage including the multivibrator 11 includes first and second switching devices 26 and 27 in two legs or paths of a circuit. One terminal of each of the devices is connected to opposite ends of the primary 28 of a center tapped transformer. A supply voltage $V_1$ is applied to the center tap. The devices are selected such that the voltage $V_1$ is greater than the breakdown voltage $V_B$ for the device 27 and less than the breakdown voltage $V_B$ for the device 26. A diode 29 is connected in series with the switching device 26. Modulated pulses are capacitively coupled at the common terminal of the switching device 26 and diode 29. A commutating capacitor 30 is connected between the corresponding terminals of the devices 26 and 27. The secondary 31 of the transformer may be connected to a suitable load, for example, to the coil 32 of a speaker 33.

Operation of the monostable multivibrator circuit 11 is substantially as follows: In its quiescent state, the voltage $V_1$ will serve to cause the switching device 27 to switch to its low impedance state whereby high currents flow between the center tap and ground through device 27. These currents are transformed through the transformer and applied to an associated load. The switching device 26 has a higher breakdown voltage whereby this path will be in its high impedance state. As soon as a negative going voltage pulse is applied to the capacitor 12, the voltage across the device 26 will increase to a value above its switching value to cause the device to switch into its low conductance state. At this point, the corresponding terminal of the capacitor 30 is connected substantially to ground. The current through the device 27 is reduced below its holding value and it is switched off. Current is supplied through the device 26 by the battery $V_1$ and the capacitor 30. The current supplied by the battery is limited by the load reflected into the primary of the transformer.

The capacitor then charges in an opposite sense to the switching voltage of the switching device 27. The switching device 27 is switched and the capacitor effectively grounded. The device 26 is switched off in the same manner as described with reference to switching on of switching device 26 and off of switching device 27. The capacitor 30 recharges to one half (½) initial voltage which is below the breakdown voltage for switching device 26. The timing is dependent upon the value of capacitor 30 and the load reflected into the circuit by the transformer. The circuit then remains in its stable condition with device 27 conducting and 26 turned off until the next pulse is applied at which time the circuit operates through one cycle.

Figure 11:
FIGURE 11 shows the current flowing in one leg or path of the monostable circuit of FIGURE 1 in response to pulses of the type shown in FIGURE 10.
Figure 12:
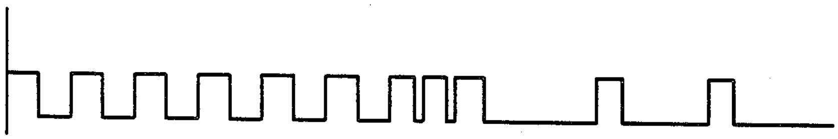
FIGURE 12 shows the current flow in the other leg or path of the monostable circuit of FIGURE 1 in response to pulses of the type shown in FIGURE 10.
Figure 13:
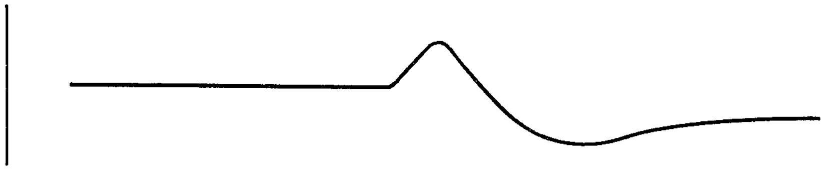
FIGURE 13 shows the audio information recovered from pulse trains of the type shown in FIGURES 11 and 12.

The foregoing operation is schematically illustrated in FIGURES 11 and 12 wherein FIGURE 11 shows the current flowing in the device 26, while FIGURE 12 shows the current flowing in the device 27. The two legs are connected in push-pull across the primary of the output transformer. The loudspeaker forms a filter which recovers the audio as indicated in FIGURE 13.

The average value may also be obtained by a suitable filter circuit.

Figure 2:
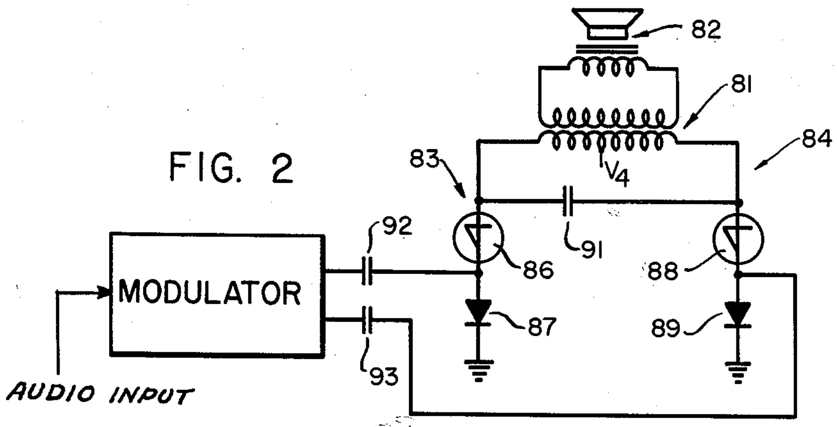
FIGURE 2 shows an audio amplifier circuit employing a modulator and a bistable multivibrator circuit.
Figure 3:
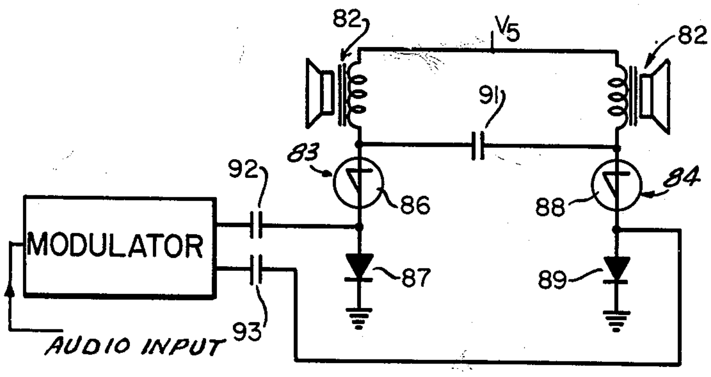
FIGURE 3 shows an audio amplifier circuit similar to that of FIGURE 2 in which the load is connected directly into the multivibrator circuit.
Figures 4, 5, 6:
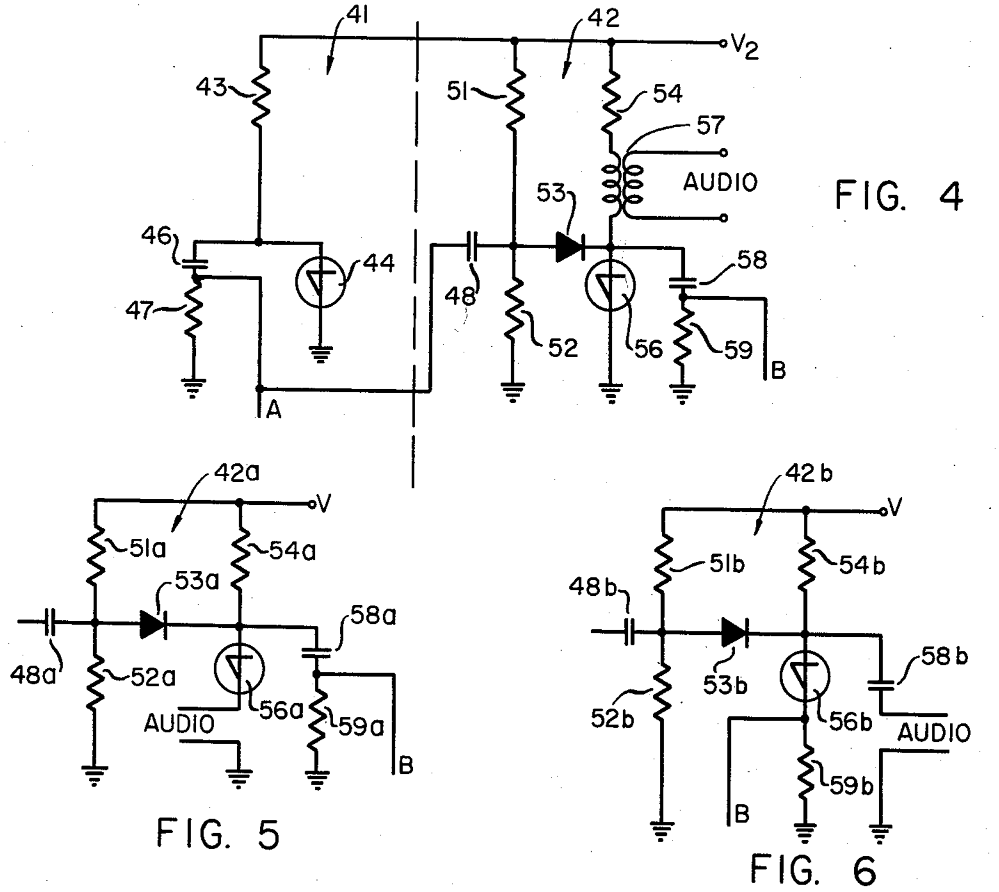
FIGURE 4 shows a suitable modulator for use in the circuits of FIGURES 2 and 3.
FIGURE 5 shows a modification of the delay portion of the circuit of FIGURE 4.
FIGURE 6 shows another modification of the delay portion of the circuit of FIGURE 4.

A different type of modulator is used in conjunction with the multivibrator circuits shown in FIGURES 2 and 3. One suitable modulator is shown in FIGURE 4 and generally includes an oscillator portion 41 and a time delay portion 42. Basically, the oscillator portion 41 serves to produce output pulses, A, which have a predetermined frequency. These pulses are used to drive one side of the associated multivibrator to be presently described in detail. The pulses are also employed to drive a time delay circuit whose function is to produce a second pulse, B, delayed from the input pulse, A, by an amount which is proportional to the audio input voltage.

Figure 14:
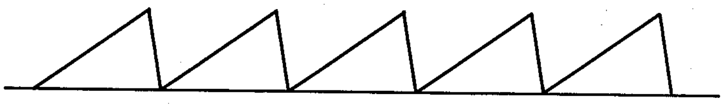
FIGURE 14 shows the oscillations of the oscillator portion of the circuit shown in FIGURE 4.

The oscillator 41 may be of the type previously described with respect to FIGURES 7, 8 and 9. The circuit illustrated is a circuit of the general type shown in FIGURE 8. This circuit serves to oscillate at a constant frequency, FIGURE 14, and will produce output pulses of the type shown in FIGURE 15.

Figure 15:
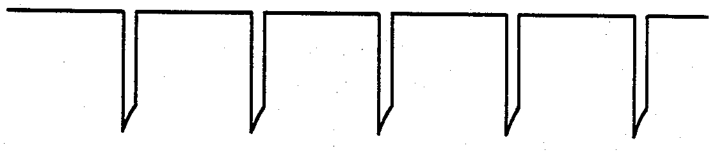
FIGURE 15 shows the output pulses from the oscillator portion of the circuit shown in FIGURE 4.
Figure 16:
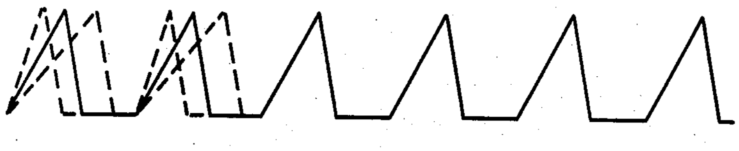
FIGURE 16 shows the delayed sawtooth pulses formed in the circuit of FIGURE 4.

The oscillator circuit includes a current limiting resistor 43 connected in series with a switching device 44 between the input voltage $V_2$ and ground. In shunt therewith is placed the capacitor 46 and load resistor 47. The output pulses, A, FIGURE 15, are derived at the common terminal of the capacitor 46 and resistor 47. These pulses are capacitively coupled through the capacitor 48 to the time delay circuit 42.

Figure 17:
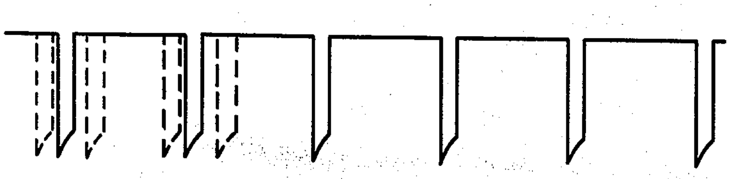
FIGURE 17 shows the delayed output pulses formed by the circuit of FIGURE 4.

The time delay circuit includes a resistive divider including serially connected resistors 51 and 52. The common terminal of the resistors is connected to one terminal of a diode 53. A series combination of current limiting resistor 54 and switching device 56 is connected between the voltage supply $V_2$ and ground. Means, for example, a transformer 57 is employed for applying the audio modulating voltage which modulates the voltage across the switching device 56. The other terminal of the diode 53 is connected to one terminal of the switching device 56. A capacitor 58 and load resistor 59 are connected in shunt with the switching device. Output pulses, B, FIGURE 17, are derived at the common terminal of the capacitor 58 and the resistor 59.

Operation of the time delay circuit is substantially as follows: The switching device 56 in the time delay circuit is held in its low impedance state by the current applied through the resistor 51 and diode 53 and through the resistor 54. Under this condition and in the steady state, the capacitor 58 will be discharged. When a negative pulse, A, arrives from the oscillator section 41, it turns off the diode 53 and allows the capacitor 58 to charge towards the voltage $V_2$ through resistor 54. When the pulse from the oscillator is terminated the capacitor will be slightly charged and reverse-bias the diode 53. This isolates the resistors 51 and 52 from the remainder of the time delay circuit. The capacitor will then continue to charge through the resistor 54 until it reaches a voltage equal to the breakdown voltage, $V_{B1}$, of the device 56. The device then breaks down and the conventional diode will then allow current to pass through the resistor 51 to the switching device 56 thereby holding the switching device 56 in its low impedance state.

When a modulating audio signal voltage is applied in series with the switching device as indicated, the time delay produced by this circuit will be a function of the audio voltage. Hence, the point in time of switching of the switching device 56 is determined in part by the audio voltage.

In the absence of input audio voltage, it is desirable to arrange the circuit so that the pulses, B, are produced symmetrically spaced from the pulses, A, from the master oscillator. This is indicated by the relationship of the pulses in FIGURES 15 and 17.

For example, the pulses, A, may be generated at 100 kc. rate in the master oscillator. The pulses, B, will also occur at 100 kc. rate half-way between (delayed one-half cycle) the pulses, A. When an audio signal is present, it modulates the time delay and the pulses, B, will be asymmetrically spaced with respect to the pulses, A. Pulses from B will still appear to have a 100 kc. rate, but varying in this time. This is indicated by the dotted pulses, FIGURE 17.

Referring to FIGURE 5, a time delay circuit **42*a*** similar to that of FIGURE 4 is illustrated. However, the point of application of the audio signal is different. Operation of this circuit is substantially the same as described above. In the circuit of FIGURE 6, the audio signal is applied in series with the capacitor and the output resistor is connected in series with the switching device. However, operation is similar to the above and will not be described in detail.

The power output stage for either of the modulators is basically a D.-C. to A.-C. inverter in the form of a multivibrator. One side of the bistable multivibrator or inverter is driven by the pulses, A, and the other side is driven by pulses, B.

The multivibrator itself, as can be seen in FIGURE 2, comprises two identical legs 83 and 84. The leg 83 includes a switching device 86 and a diode 87 connected in series between ground and the center tap of the transformer which has applied thereto the voltage $V_4$. The leg 84 includes switching device 88 and diode 89 which are serially connected between ground and the voltage applied to the center tap of the transformer 81. A commutating capacitor 91 is connected between similar terminals of the devices 86 and 88. The pulses, A, are coupled to the common terminal of the switching device 86 and diode 87 by capacitor 92, and the pulses, B, are coupled to the common terminal of the switching device 88 and diode 89 by capacitor 93.

Application of the negative pulses 16 to the common terminal of the switching device 86 and diode 87 will serve to cause the voltage across the switching device 86 to exceed the breakdown voltage thereby causing this current path to conduct relatively high currents. The current through device 88 is reduced below the holding value to switch it off. This state will continue until the occurrence of the pulses, B, FIGURE 17, at which time the device 88 will be switched on and the capacitor 91 will tend to supply current to this path and reduce the current to the device 86 below the holding value whereby leg 83 is turned off and leg 84 is turned on. This process is repeated at the occurrence of each pulse.

Figure 18:
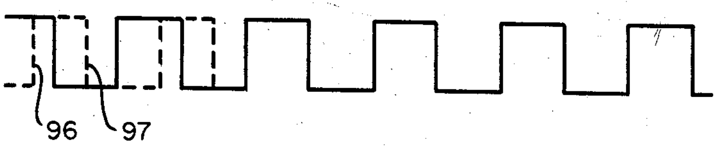
FIGURE 18 shows typical currents flowing in one of the legs or paths of the multivibrators of FIGURES 2 and 3 in response to the input pulses shown in FIGURES 15 and 17.

Referring particularly to FIGURES 15, 17 and 18 the pulses in solid line correspond to no audio input signal voltage, and for this condition the current through either of the paths 83 or 84 will be on and off an equal amount of time. However, as the pulses 18 are delayed or advanced, then the corresponding path 84 will either be on for a longer or lesser period of time as indicated by dotted curves 96 and 97. The result is to provide an average output power which varies with the input audio signal. The speaker 82 connected to the transformer 81 serves as an averaging filter to recover the amplified audio. It is, of course, apparent that other types of filter loads may be employed for driving circuits other than speakers.

A second type of power output stage may be employed as illustrated in FIGURE 3. Here, there is provided a multivibrator which is driven by pulses, A and B, from the modulator. In place of the center tap transformer driven from voltage $V_5$, the speakers are directly connected in each of the current paths 83 and 84. There may be a slight phase difference between the speakers which may be unobjectionable for many audio purposes. However, if such a phase relationship is objectionable, one of the speakers may be replaced by a resistive load and a single speaker used. The advantage is that there are no transformers or weighty items required in the circuit. It is also conceivable that a center tap speaker may be designed for an application of this type.

In one particular example, a circuit of the type shown in FIGURE 4 was constructed and employed to drive a circuit of the type shown in FIGURE 3. In the circuit constructed, the various components had the following values:

| | | |
|---|---|---|
| Resistors: | | |
| **43** | ohms | 10k |
| **47** | do | 470 |
| **51** | do | 13.5k |
| **52** | do | 500 |
| **54** | do | 3.5k |
| **59** | do | 470 |
| Capacitors: | | |
| **46** | mf | .007 |
| **48** | mf | .0015 |
| **58** | mf | .003 |
| **92** | mf | 1000 |
| **93** | mf | 1000 |
| **91** | mf | .035 |

Switching device 44 is known by manufacturer's spec., Shockley, as 20 v., 20 mil Switching devices 56, 86 and 88 are known by manufacturer's spec., Shockley, as 20 v., 20 mils Diodes 53, 87 and 89 are known by manufacturer's spec. as Sarks-Tarzian F 6

A circuit of the foregoing character was selected so that in the absence of input audio signal, the frequency of switching of the inverter modulator was at approximately 40 kc. Complete pulse deviation modulation was achieved for anodic input of 21 volts.

Thus, it is seen that there is provided an audio amplifier which is capable of linear operation with relatively high gain with a minimum number of components and with good fidelity.

I claim:

1. An amplifier comprising a converter circuit having first and second current paths, each of said paths including a semiconductor switching device of the type having a first stable state in which the device presents a relatively high impedance and a second stable state in which the device presents a relatively low impedance, said device being switched from the first to the second stable state in response to a predetermined voltage applied across the same and from its second to its first state when the current through the device is below a predetermined value, means for applying a voltage across said semiconductor switching devices which is greater than the predetermined switching voltage for at least one of said switching devices, a commutating capacitor connected between said first and second current paths, a load circuit connected to said current paths, modulating means connected to receive a varying voltage input signal to be amplified and form a first pulse train having a substantially constant frequency to be applied to one path of the converter circuit and a second pulse train in which the pulses are delayed with respect to the first pulses an amount proportional to the input signal voltage of the signal to be amplified, and means for applying the pulses to the converter circuit to control switching of the switching device in at least one of said legs from the first to the second state in response to the pulses applied thereto, said load circuit serving to recover the amplified input signal from the converter.

2. An amplifier comprising a converter circuit having first and second current paths, each of said paths including a semiconductor switching device of the type having a first stable state in which the device presents a relatively high impedance and a second stable state in which the device presents a relatively low impedance, said device being switched from the first to the second stable state in response to a predetermined voltage applied across the same and from its second to its first state when the current through the device is below a predetermined value, a diode connected in each of said current paths in series with the switching device, means for applying a voltage across said paths which is greater than the predetermined switching voltage, a commutating capacitor connected between said first and second current paths, a load circuit connected to said current paths, modulating means adapted to form a first pulse train having a substantially constant frequency, means for applying said pulse train to the common terminal of the diode and switching device in one of said paths, the last named means serving to receive a signal to be amplified and forming a second pulse train in which the pulses are delayed with respect to the pulses in the first pulse train an amount proportional to the signal to be amplified, and means for applying said delayed pulses to the common terminal of the switching device and diode in the other of said paths.

3. An amplifier as in claim 2 wherein said modulating means comprises an oscillator section forming pulses at a predetermined frequency, and a delay section forming pulses in response to the pulses from the first pulse train but delayed with respect thereto an amount corresponding to the signal to be amplified.

References Cited in the file of this patent

UNITED STATES PATENTS

| | | |
|---|---|---|
| 2,617,027 | Douma | Nov. 4, 1952 |
| 2,864,905 | Grantges et al. | Dec. 16, 1958 |
| 2,990,516 | Johannessen | June 27, 1961 |
| 2,997,604 | Shockley | Aug. 22, 1961 |
| 3,018,392 | Jones | Jan. 23, 1962 |
| 3,048,710 | Shockley | Aug. 7, 1962 |

OTHER REFERENCES

Proceedings of the IRE, July 1959, article by Sommers, Jr., "Tunnel Diode as High-Frequency Devices," pages 1201–1206.

Application Data, Shockley Transistor, Unit of Clevite Transistor, No. AD–6, October 1959.